United States Patent
Hill et al.

(10) Patent No.: US 7,324,317 B2
(45) Date of Patent: Jan. 29, 2008

(54) CONTROL OF BREAKDOWN VOLTAGE FOR MICROELECTRONIC PACKAGING

(75) Inventors: Michael J. Hill, Gilbert, AZ (US); Weimin Shi, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 524 days.

(21) Appl. No.: 10/932,152

(22) Filed: Aug. 31, 2004

(65) Prior Publication Data

US 2006/0044717 A1   Mar. 2, 2006

(51) Int. Cl.
  *H02H 3/22* (2006.01)
(52) U.S. Cl. ........................................ 361/111
(58) Field of Classification Search ............... 361/111, 361/56
  See application file for complete search history.

(56) References Cited

U.S. PATENT DOCUMENTS

| | | | | |
|---|---|---|---|---|
| 4,532,419 A | * | 7/1985 | Takeda | ........................ 235/492 |
| 5,970,321 A | * | 10/1999 | Hively | ........................ 438/123 |
| 6,002,569 A | * | 12/1999 | Horvath | ........................ 361/111 |
| 6,101,078 A | * | 8/2000 | Fujii et al. | ................... 361/111 |
| 6,433,394 B1 | * | 8/2002 | Intrater | ........................ 257/355 |
| 6,597,187 B2 | * | 7/2003 | Eldridge et al. | ............. 324/754 |
| 6,752,635 B1 | | 6/2004 | Searls et al. | |

* cited by examiner

*Primary Examiner*—Michael Sherry
*Assistant Examiner*—Scott Bauer
(74) *Attorney, Agent, or Firm*—Blakely, Sokoloff, Taylor & Zafman LLP (57) ABSTRACT

Reduce breakdown voltage and control breakdown path for electrostatic discharge to terminals of microelectronic packages, such as no-connect Land Grid Array (LGA) pads. In one embodiment, solder resist openings with a small separation distance are used to provide an air breakdown path between a no-connect LGA pad and the surrounding metal and to reduce the breakdown voltage. In one implementation, the no-connect pad has a non-round shape with a protruding portion on the dielectric layer. The air surrounding a solder resist opening over the tip of the protruding portion of the no-connect pad and a nearby solder resist opening over the surrounding metal provides a shortest air breakdown path and the lowest breakdown voltage. Alternatively, sharp features (e.g., metal traces) with a minimum separation distance can be arranged pointing at each other under the solder resist layer, or other dielectric layer inside the package, to provide a non-exposed breakdown path.

24 Claims, 10 Drawing Sheets

CONTROL OF BREAKDOWN VOLTAGE FOR MICROELECTRONIC PACKAGING

FIELD

At least some embodiments of the invention relate to microelectronic packaging, and more specifically, to protection against electrostatic discharge (ESD).

BACKGROUND

A microelectronic package uses conductive materials to electrically connect the Integrated Circuit (IC) formed on a chip to the terminals of the package for further connection to other components on a circuit board. Dielectric insulating materials in the microelectronic package electrically insulate traces of the conductive materials from each other to form the desired interconnect from the IC chip to the terminals of the package. The package may be directly mounted on the circuit board, or through a socket or interposer.

A sophisticated Integrated Circuit (IC) chip such as a microprocessor uses a large number of terminals for connection to a circuit board. Various packaging techniques have been developed to provide the terminals for connection to the circuit board with an increasing number of terminals on a small size package. A grid array type of packaging technique arranges the terminals in a grid array pattern on one side of the package, such as a Pin Grid Array (PGA) package, a Ball Grid Array (BGA) package, a Column Grid Array (CGA) package, or a Land Grid Array (LGA) package. These terminals are typically based on flat pads formed on a dielectric layer of the package. For example, in a land grid array package a solder resist opening defines the land out of a portion of a pad; in a ball/column grid array package a solder ball/column is attached to the pad through a solder resist opening.

Some of the terminals of a package may be designed as no-connect terminals, which do not require a connection. A no-connect pad may be used as a spacer when the number of pins required by the IC circuit is smaller than the available terminals provided by the package. No-connect terminals are typically not electrically connected to allow for compatibility with future devices in case these terminals are used. Thus, the no-connect terminals are electrically insulated from the circuitry including the IC chip and the components on the circuit boards.

The atoms in dielectric materials have very tightly-bound electrons to resist electron flow. However, dielectric materials cannot resist indefinite amounts of voltage. When enough voltage applied, any insulating material will eventually break down to allow electron flow. Thus, when the applied voltage is smaller than a breakdown voltage, the dielectric material is not conductive; when the applied voltage reaches the breakdown voltage, the dielectric material breaks down to become conductive. Once current is forced through an insulating material, breakdown of the molecular structure of the dielectric material has occurred. After breakdown, the material may or may not behave as an insulator any more. Soft breakdown is reversible, which typically happens at a much lower voltage level than hard breakdown. Hard breakdown is irreversible, which causes permanent damage. Tunneling may start before soft breakdown. During breakdown (e.g., tunneling, soft breakdown, hard breakdown), an insulator acts as a conductor, reversibly or irreversibly. The breakdown voltage of an insulating material is determined by the material property and the thickness of the insulating material.

Air surrounding the terminals is typically not conductive. However, the air breaks down (discharges) when an electrostatic field is strong enough, resulting in an electrostatic discharge event, which may cause permanent damage to the circuitry and the package.

BRIEF DESCRIPTION OF THE DRAWINGS

The accompanying drawings illustrate by way of example and not limitation, in which like references indicate similar elements.

DETAILED DESCRIPTION

In the following description, numerous specific details are set forth. However, it is understood that embodiments of the invention may be practiced without these specific details. In other instances, well-known circuits, structures and techniques have not been shown in detail in order to avoid obscuring the understanding of the disclosure. References to one or an embodiment in the present disclosure are not necessarily references to the same embodiment; and, such references mean at least one.

In one embodiment of the present invention, a no-connect pad is allowed to dissipate an ESD event at lower ESD voltages through one or more specifically designed features on the LGA pad to reduce breakdown voltage. These features can reduce or eliminate the detrimental effects of ESD events striking no-connect pads.

Traditional LGA pads are circular. A traditional LGA package does not have features designed for a no-connect LGA pad to reduce the breakdown voltage to neighboring structures. After a no-connect LGA pad is created, it is possible for an ESD event hitting the no-connect LGA pad to arc to a neighboring pad in an uncontrolled way. If an ESD event occurs on a traditional no-connect pad, breakdown allows a discharge current to flow in a discharge current path, which can include metal traces connected to the silicon die. The discharge current to the silicon die can damage the circuit on the die. Because the breakdown event is highly non-linear, the time duration of the applied ESD pulse can be dramatically altered, rendering the on-die protection circuitry vulnerable to failure. Further, the uncontrolled ESD event may cause short circuit and/or other damage to the package.

It is advantageous to reduce the break down voltages for pads that are not connected to signal lines (no-connect pads). At least one embodiment of the present invention uses features with sharp points and/or small separation distances to increase the electric field strength along a designed ESD breakdown path to eliminate and/or control the ESD damage.

The breakdown voltage (e.g., the voltage required to pull an arc through the air between an LGA pad and the nearby metal, or the voltage to break down a dielectric material of the package) is dependent on the dielectric properties of the surrounding material and the electric field strength between the two metals. For a given voltage between two conductors, the electric field is dependent on the geometry of the conductors and the separation distance between the two conductors. At least one embodiment of the present invention creates special features with narrow gaps to decrease the breakdown voltage for the no-connect pad.

The mechanism can be explained through examining two ideal cases: 1) the electric field between two smooth parallel conductors; and, 2) the electric field near sharp points on a charged conductor. The voltage between two smooth parallel conductors is:

Voltage=electric field strength×separation distance

For a fixed voltage, a smaller separation distance will result in higher electric field strength. Further, the electric field strength increases near sharp points on a charged conductor. Thus, adding features with sharp points and/or small separation distances can increase the local electric field strength.

A given dielectric material can resist only up to certain threshold electric field strength, above which breakdown (e.g., arcing/discharge) will occur. For example, the breakdown electric field strength in air is approximately $3 \times 10^6$ V/m. At least one embodiment of the present invention uses features to increase the field strength along a designed path between an LGA pad and its surrounding metal for a given voltage so that an arc (or breakdown) can be pulled at a low voltage, limiting or eliminating the damage caused by the ESD.

Although many examples are illustrated for high density LGA pads (e.g., with an average spacing between lands in the grid array being less than 400 microns), these features can also be implemented on other types of package technologies that utilize no-connect terminals (e.g., pins or solder balls/columns).

At least one embodiment of the present invention places one or more features on the LGA pad and/or the neighboring metal to limit the breakdown voltage and improve the ESD performance of the pad. When the breakdown voltage is limited and the ESD breakdown path is controlled using the specifically designed features, the damage to the package due to the ESD event can be eliminated or limited in a controlled way.

In one embodiment of the present invention, a microelectronic assembly includes an integrated circuit chip, a circuit board, and an interconnect structure disposed between the integrated circuit chip and the circuit board. The interconnect structure includes a dielectric layer and a metal layer formed on the dielectric layer. The metal layer includes a plurality of pads and a surrounding portion. The surrounding portion and the pads are separated from each other on the dielectric layer. At least one of the pads is a no-connect pad; some of the pads are configured to electrically connect the integrated circuit chip and the circuit board.

The interconnect structure further includes a solder resist layer on the pads and the surrounding portion of the metal layer. The solder resist layer has openings in a grid array to expose the pads for connections to the circuit board. Further, to reduce the breakdown voltage of the no-connect pad, the solder resist layer is designed to have an opening to expose a portion of the surrounding portion of the metal layer. The distance between the opening to expose the surrounding portion of the metal layer and an opening in the solder resist layer to expose the no-connect pad is smaller than the distance between an opening to expose the no-connect pad and another opening to expose another pad. Thus, when the electrostatic voltage is built up, the electrostatic discharge path goes from the no-connect pad to the surrounding portion of the metal layer, not to a neighboring pad.

In one implementation, the no-connect pad has a protruding portion under the solder resist layer. The protruding portion is arranged to point toward the opening over the surrounding portion of the metal layer. The solder resist layer has a further opening to expose a tip portion of the protruding portion of the no-connect pad. In one example, the distance between the openings for the tip portion of the no-connect pad and the surrounding portion of the metal layer is no more than 70 microns, reducing the breakdown voltage to no more than 210 volts. In one embodiment, the average spacing between the pads is less than 500 microns and larger than the distance between the opening over the surrounding portion of the metal layer and the opening over the tip portion of the protruding portion. To protect the openings over the surrounding portion of the metal layer and the tip portion of no-connect pad from being contacted by foreign objects, their diameters are designed to be smaller than the diameter of the openings for connections.

Figure 1:
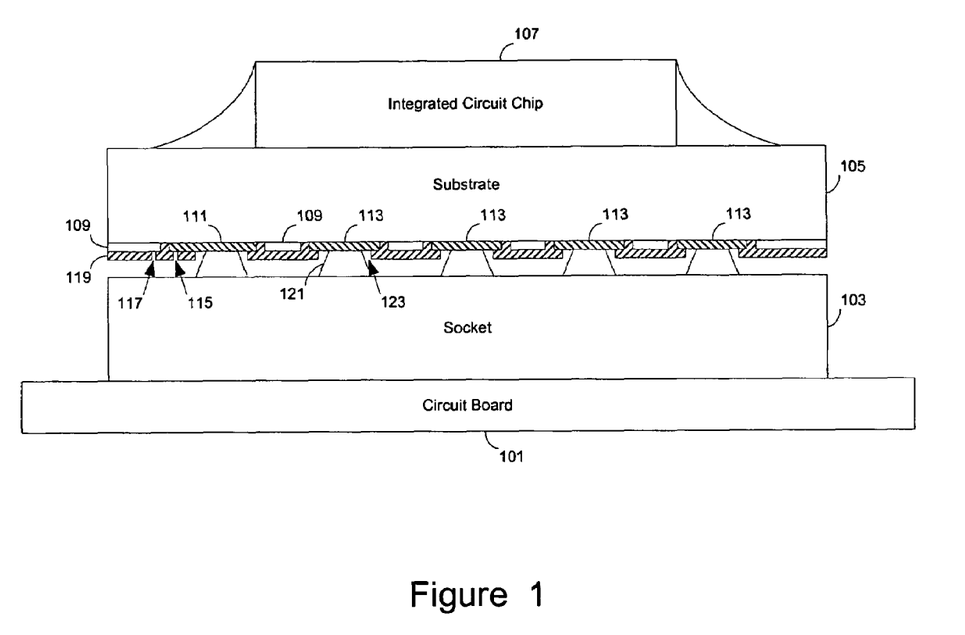
FIG. 1 illustrates a microelectronic device with features to control the breakdown voltage for electrostatic discharge according to one embodiment of the present invention.

In one embodiment of the present invention, a land grid array pad has one or more features designed to reduce the potential required to draw an arc to the surrounding metal. FIG. 1 illustrates a microelectronic device with features to control the breakdown voltage for electrostatic discharge according to one embodiment of the present invention. In FIG. 1, an integrated circuit chip (107) is mounted on the substrate (105), which typically has metal traces and vias to connect the integrated circuit to pads (113) of the package. The pads and the surrounding metal (109) on a dielectric layer of the substrate (105) are covered with a solder resist layer (119). The solder resist layer (119) has a grid array of solder resist openings (e.g., 123) to define lands out of the pads of the land grid array package. In one embodiment, the average spacing between lands of the land grid array package is less than 400 microns (e.g., 310 microns).

A no-connect pad (111) is not electrically connected to the circuit of integrated circuit chip (107). The no-connect pad (111) is typically not electrically connected to the circuitry on the circuit board (101).

In one embodiment of the present invention, features are designed for the no-connect pad (111) to reduce the breakdown voltage. For example, the solder resist layer (119) has closely spaced openings (115 and 117) to expose a portion of the no-connect pad (111) and a portion of the surrounding metal (109). These openings (115 and 117) are much smaller than the openings that define the lands to avoid being accidentally bridged or being contacted by foreign objects. The distance between these openings (115 and 117) is smaller than the distance between the lands of the land grid array package so that the breakdown path for an ESD event involving the no-connect pad goes through the air between these openings (115 and 117), not to a neighboring pad. Further, in one embodiment, the distance between these openings (115 and 117) is minimized to reduce the breakdown voltage such that a breakdown event causes no damage.

Thus, a conductive portion of the substrate is arranged with respect to the no-connect pad to have a short electrostatic discharge breakdown path between the conductive portion and the no-connect pad. When sufficient charges accumulate in the no-connect pad to cause an ESD event, the electrostatic discharge breakdown goes through the air around the closely spaced openings (115 and 117). The length of the breakdown path is designed to be smaller than a distance between the no-connect pad and any closest neighboring terminal of the no-connect pad and designed to be smaller enough to allow breakdown in air at a low voltage (e.g., less than 400 volts).

A socket (103) is used to mount the package on the circuit board (101). The socket has contacts (e.g., 121) to contact the lands of the land grid array package to make electric connections to the circuit on the board (101). The contacts (e.g., 121) and socket (103) may use bunched wire, metal particles in polymer, metal wires in polymer, or stamped metal springs or contact pins. Although FIG. 1 illustrates an example of a land grid array package, similar features can also be used on other types of package techniques. For example, the socket (103) and contacts (e.g., 121) may be replaced with solder balls in a ball grid array type of package, or solder columns in a column grid array type of package or pins in a pin grid array type of package.

Although FIG. 1 shows an example in which the breakdown path is designed to go through the air surrounding the openings (115 and 117) in the solder resist layer, other types of features which lead to a breakdown path under the solder resist layer can also be used. Detailed examples of various different types of features to reduce the breakdown voltage for electrostatic discharge are provided below.

Figure 2:
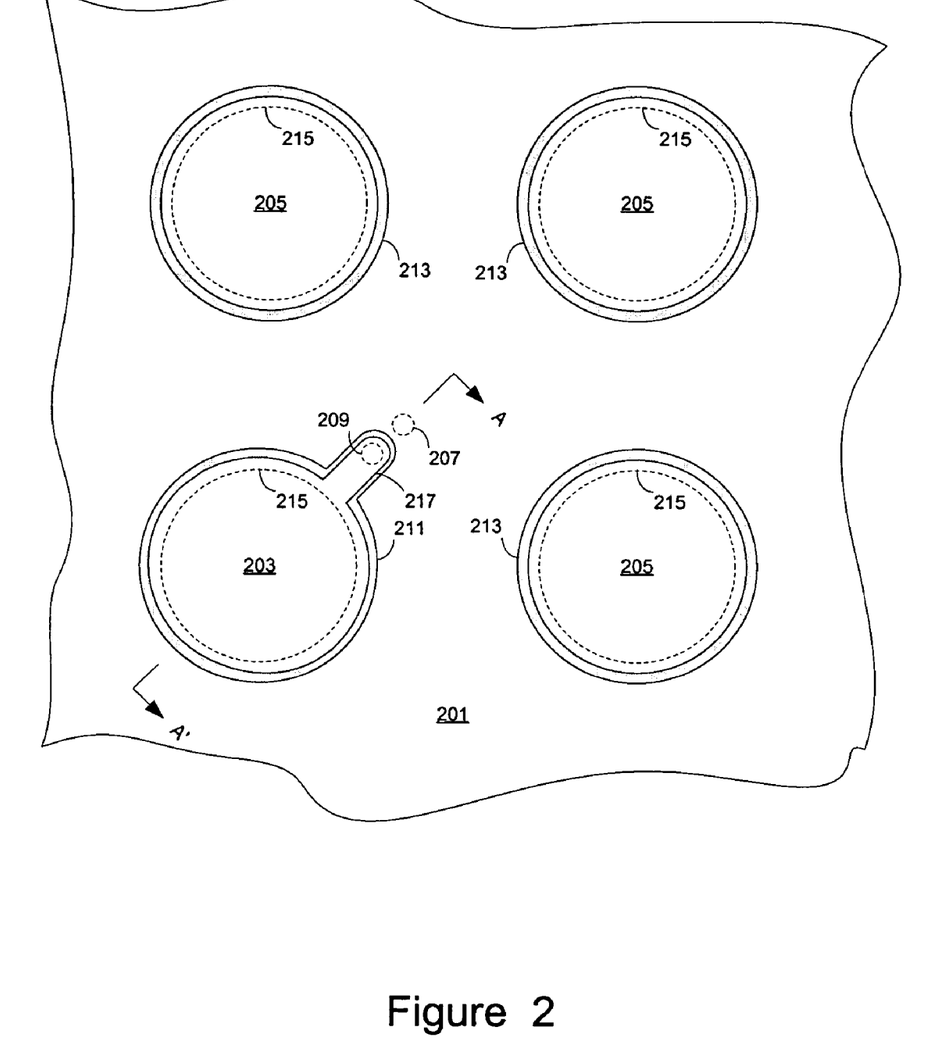
FIGS. 2-5 illustrate one example to reduce the breakdown voltage for electrostatic discharge according to one embodiment of the present invention.

One embodiment of the present invention provides no-connect LGA pads with low breakdown voltage (e.g., less than 500 volts). In one embodiment, an ESD breakdown path is designed to go through the air surrounding the no-connect pad and a conductive portion of the package. For example, FIGS. 2-5 illustrate one such example to reduce the breakdown voltage for electrostatic discharge. In FIG. 2, a metal layer includes pads (203 and 205) and the surrounding metal (201). Pads (205) are typically round pads for lands that require connections. According to one embodiment of the present invention, the no-connect pad (203) has a non-round shape with a protruding portion (217). The gaps (211 and 213) between the pads (203 and 205) and the surrounding metal (201) are filled with the solder resist material when the solder resist layer is applied on the metal layer.

The positions of the solder resist openings are illustrated with the dotted lines in FIG. 2. It is seen that solder resist openings (215) define an array of lands from the pads (203 and 205). Further, additional solder resist openings (209 and 207) define a feature to reduce the breakdown voltage for electrostatic discharge. These additional solder resist openings (209 and 207) are close to each other to create a short air distance between the no-connect pad (203) and the surrounding metal (201). In one embodiment of the present invention, a metal-to-metal air distance between the solder resist openings (209 and 207) is minimized to reduce the breakdown voltage.

The solder resist opening (209) exposes a tip portion of the protruding portion (217) of the no-connect pad (203); and the solder resist opening (207) exposes a nearby portion of the surrounding metal (201). Since the solder resist can resist a higher voltage than the air surrounding the solder resist openings (209 and 207), the air breaks down to release the electrostatic charges when an electrostatic voltage is built up on the no-connect pad (203). Since the breakdown occurs at a low voltage (e.g., under 500 volts) in the air, no damage to the package occurs. Thus, the presence of the feature of solder resist openings (209 and 207) and the protruding portion (217) eliminates the uncontrolled discharge between the no-connect pad and an adjacent pad which may occur in a traditional package.

Figure 3:
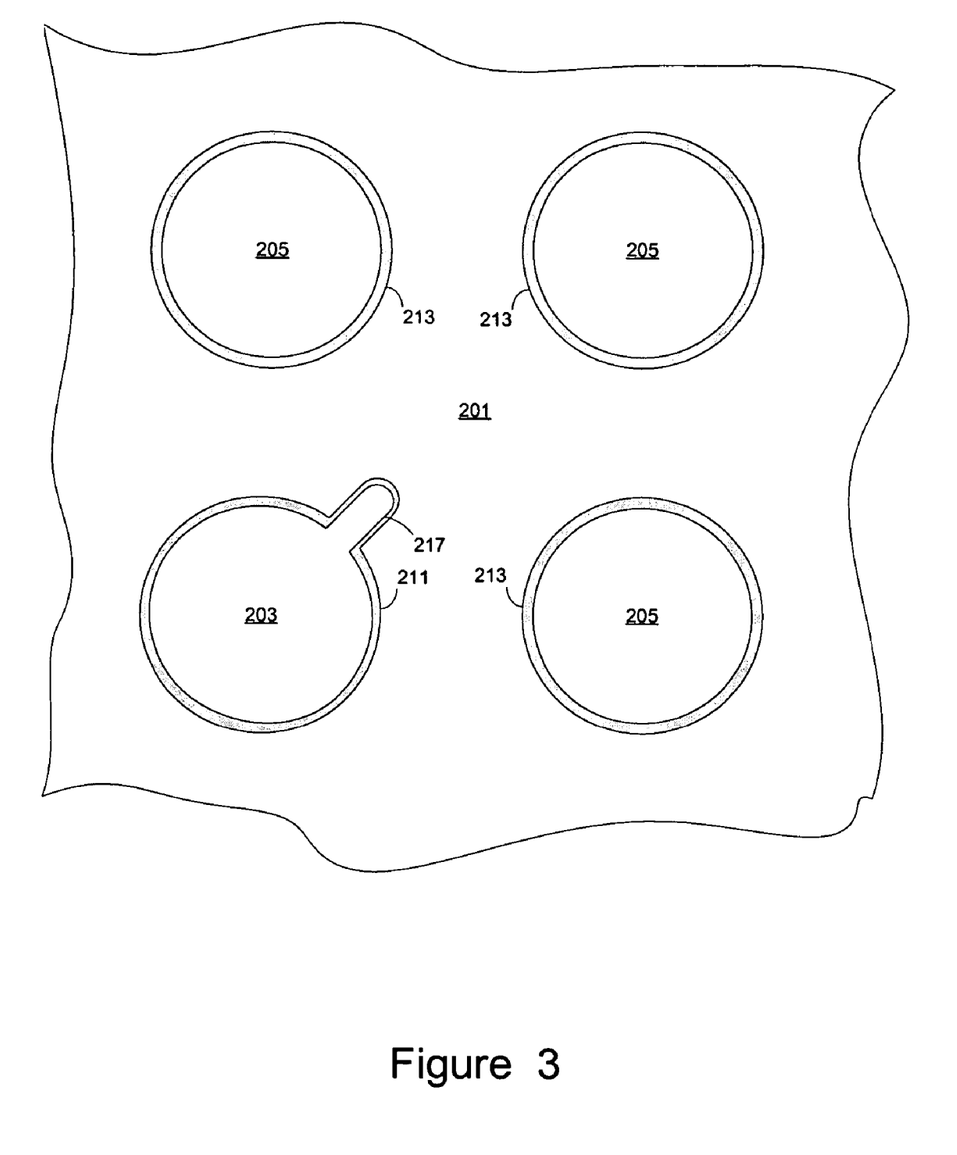

FIG. 3 shows the metal layer over a dielectric layer, including the pads (203 and 205) and the surrounding metal (201), which are separated from each other on the dielectric layer by gaps (211 and 213). The gaps (211 and 213) may be formed through an etching process after a blanket layer of metal is formed on the dielectric layer. The gaps may also be formed through other processes (e.g., an additive metallization process in which the metal pads and the surrounding portion are directly formed on the substrate, or a semi-additive metallization process in which, after the pads are plated to a desired thickness based on a blanket seed layer of metal, the metal on the gap portions of the seed layer is removed). In one embodiment, the pads are gold plated.

Figure 4:
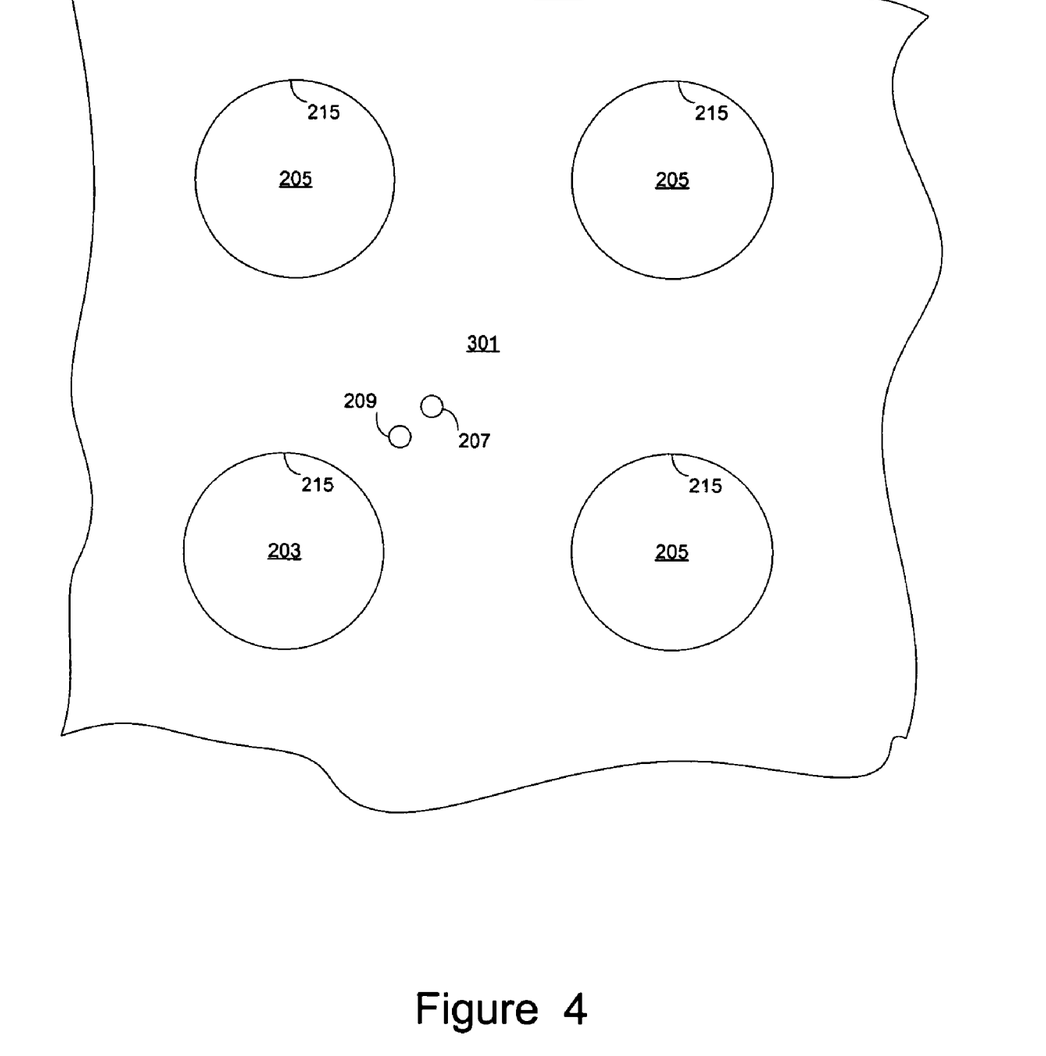

FIG. 4 shows the solder resist layer (301) over the metal layer. The solder resist layer (301) has openings (215) to define the lands from the pads. The solder resist layer (301) further has openings (207 and 209) to control the breakdown voltage by providing a short air path between the no-connect pad and the surround metal of the metal layer. When the solder resist layer (301) is applied over the metal layer, which has gaps (211 and 213) separating the pads (203 and 205) and the surrounding metal (201), the solder resist material fills in the gaps (211 and 213). Since the solder resist opening can resist a higher voltage than the air, the ESD occurs in the air between the openings (207 and 209) over and near the no-connect pad (203).

In FIG. 2, the no-connect pad (203) has a non-round shape when viewed in a direction perpendicular to the dielectric layer. The no-connect pad (203) has a protruding portion (217) formed on, and parallel to, the dielectric layer. The opening (209) exposes a tip portion of the protruding portion of the no-connect pad (203). The protruding portion (217) is arranged to point toward the opening (207) over the surrounding metal (201). The protruding portion (217) allows the openings (209 and 207) for the air breakdown path to be positioned a distance away from the land of no-connect pad (203) so that the distance between the openings (209 and 207) for the air breakdown path can be minimized.

In FIG. 2, it is seen that the solder resist openings (215) have a smaller diameter than the diameter of the corresponding pads to provide the overlapping regions in which the solder resist material covers the outside portions of the pads. The solder resist material at the overlapping regions protects the gaps (211 and 213) from being bridged. The protruding portion (217) of the no-connect pad allows a sufficient amount of overlapping to protect the gaps (211 and 213), while minimizing the distance between the opening (207) over the surrounding metal (201) and an opening over the no-connect pad (203) to minimize the breakdown voltage.

In the embodiment of FIGS. 2-5, the protruding portion and the openings (207 and 209) for the breakdown path are oriented in an angle (e.g., close to 45 degree) with respect to the grid array of lands to increase the distance from other pads to the feature designed to reduce the breakdown voltage of the no-connect pad.

Figure 5:
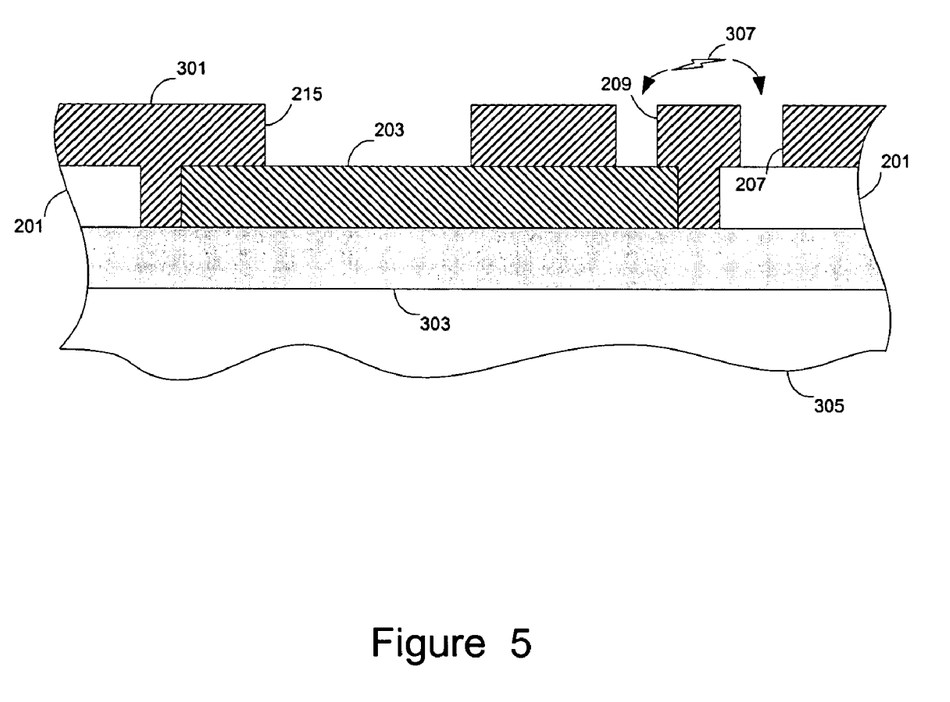

FIG. 5 illustrates a cross section view along line AA' in FIG. 2 for the feature designed to reduce the breakdown voltage of the no-connect pad. In FIG. 5, the no-connect pad (203) and the surrounding metal (201) are formed on the dielectric layer (303) of the substrate (305). The solder resist layer (301) is formed on the metal layer. In the solder resist layer (301), the opening (207) over the surrounding metal (201) and the opening (209) over the protruding portion of the no-connect pad have a small separation distance over the air between the no-connect pad (203) and the surrounding metal (201) to provide a designed air breakdown path (307). In one implementation, the solder resist material fills the gap between the no-connect pad (203) and the surrounding metal (201). Since the solder resist material in the gap between the no-connect pad (203) and the surrounding metal (201) can resist a higher voltage than the air on the designed breakdown path (307), breakdown occurs in the air around the designed feature. In one embodiment of the present invention, the length of the breakdown path (307) is approximately 70 micron (or less) so that the breakdown voltage is approximately 210 volts (or less). Since the breakdown is through the air to the surrounding metal at a low voltage (e.g., less than 400 volts), an electrostatic discharge along the breakdown path will not damage the circuitry and the package.

FIGS. 6-9 illustrate other examples to control electrostatic discharge breakdown according to embodiments of the present invention.

Figure 6:
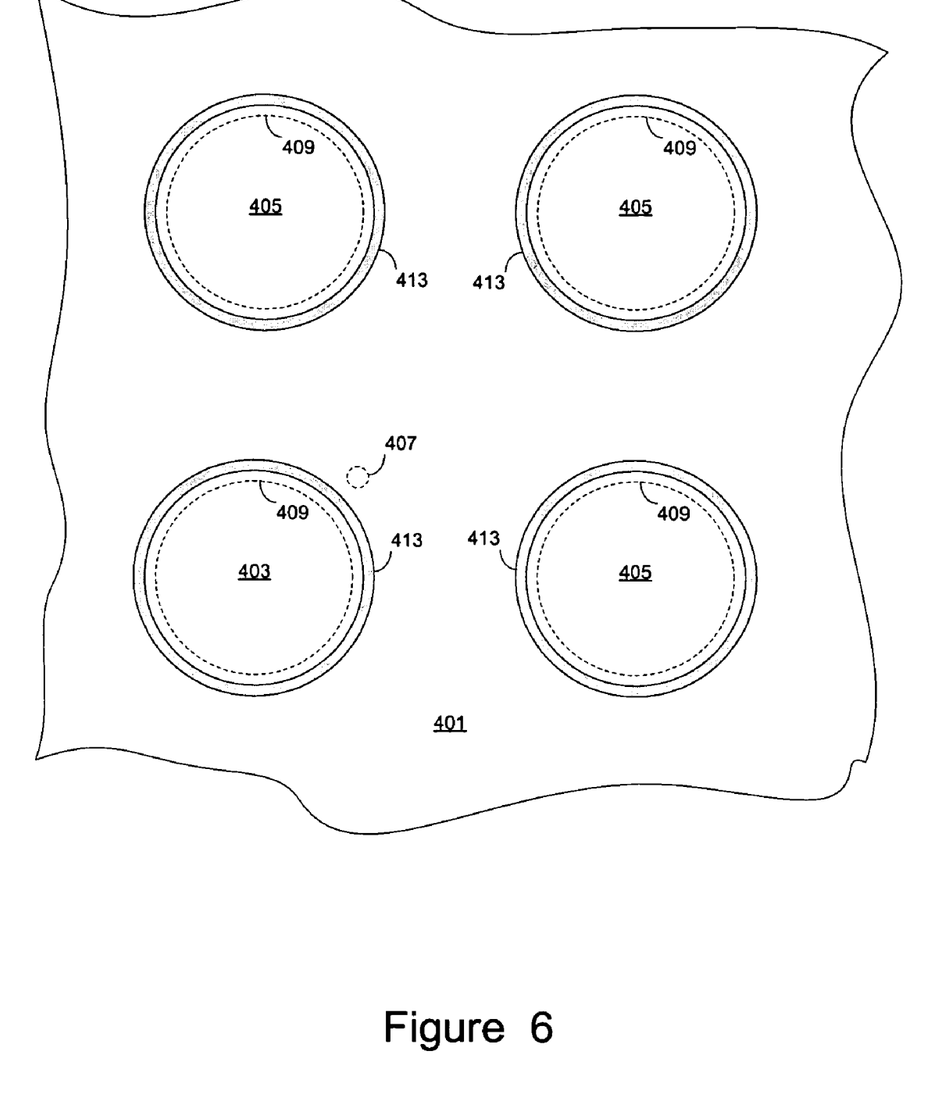
FIGS. 6-9 illustrate other examples to control electrostatic discharge breakdown according to embodiments of the present invention.

FIG. 6 shows one embodiment in which a no-connect pad has the same round shape as other pads. In FIG. 6, the gaps (413) separate the pads (403 and 405) and the surrounding metal (401). Solder resist openings (409) define the lands out of the pads. The no-connect pad (403) does not have a protruding portion. The opening (407) is close to the no-connect pad (403) to provide an air breakdown path between the no-connect pad (403) and the surrounding metal (401). In some implementations, a design rule requires a minimum distance of overlapping between the pads and the solder resist material for the protection of the gaps (413); the design rule may limit the minimum distance between the openings (409 and 407) for the designed breakdown path; and the length of the air breakdown path in FIG. 6 may not be as small as that allowed for a no-connect pad with a protruding portion illustrated in FIG. 2. In one implementation, the length of the breakdown path is about 140 microns (or shorter); and the breakdown voltage along the breakdown path is about 400 volts (or less). In one implementation, the design rule limits the length of the air breakdown path between the openings (409 and 407) designed for the no-connect pad (403) to about 130 micron; and the breakdown voltage is then approximately 390 volts.

Some embodiments of the present invention include breakdown structures placed on inner metal layers of the package with routing from the no-connect pad to the breakdown structures. The routing may connect to nets on that layer or include vias to nets on other layers, thus allowing the designer to control the ESD discharge path.

In one embodiment of the present invention, a feature to control the breakdown voltage for electrostatic discharge is entirely under the solder resist layer. For example, in FIG. 7, solder resist openings (509) define the grid array of lands out of the pads (503 and 505). Under the solder resist layer, traces (517 and 515) point to each other with sharp corners to increase the local electric field strength along a path between the traces. One trace (517) connects to the no-connect pad (503); and one trace (515) connects to the surrounding metal (501). The solder resist material filled in the gap (511) separates the traces (517 and 515). In one embodiment of the present invention, a minimum distance (limited by design rules and manufacture techniques) separates the traces (517 and 515) to reduce the breakdown voltage. The breakdown path goes through the solder resist material filled between the corners of the traces. Materials with lower soft breakdown strength are preferred for filling the gap between the traces because they prevent the charge from building to high voltage, therefore avoiding the results of more harmful discharge. Thus, when the voltage between the no-connect pad (503) and the surrounding metal (501) increases, breakdown occurs at the designed location near the tips of the traces (517 and 515).

Thus, in one embodiment, a no-connect pad has a protruding portion with a sharp corner; the conductive metal surrounding the no-connect pad also has a protruding portion with a sharp corner; the protruding portions are arranged to point to each other. The protruding portions have corners arranged to point at each other under a solder resist layer to increase the local electric field strength along a designed breakdown path, which goes through a portion of the dielectric material of the substrate structure.

In one embodiment of the present invention, a feature to control electrostatic discharge is buried inside the package underneath the metal layer for the LGA pads. For example, in FIG. 8, traces (601 and 603) are formed under the dielectric layer (611). A via (605) connects the traces (601) to the no-connect pad (609) which is formed on the dielectric layer (611). The solder resist opening (607) defines a land out of the no-connect pad (609). Other lands and pads are no shown in FIG. 8. The trace (603) connects to a desirable breakdown net (e.g., the surrounding metal over the dielectric layer (611) or the ground). In one embodiment of the present invention, these traces (601 and 603) are separated from each other at a minimum distance with sharp corners pointing at each other to increase the local electric field strength and reduce the breakdown voltage. A dielectric material filled between the traces (601 and 603) breaks down at a low voltage (e.g., less than 500 volts) to allow electrostatic discharge. Similar features can also be placed at a location distant from the non-connect LGA pad, with routing to the non-connect LGA pad, to reduce the breakdown voltage between the pad and a selected net. With routing, the features to lower the breakdown voltage (through a dielectric material or air) can be placed inside the package or on a surface of a package.

Figure 8:
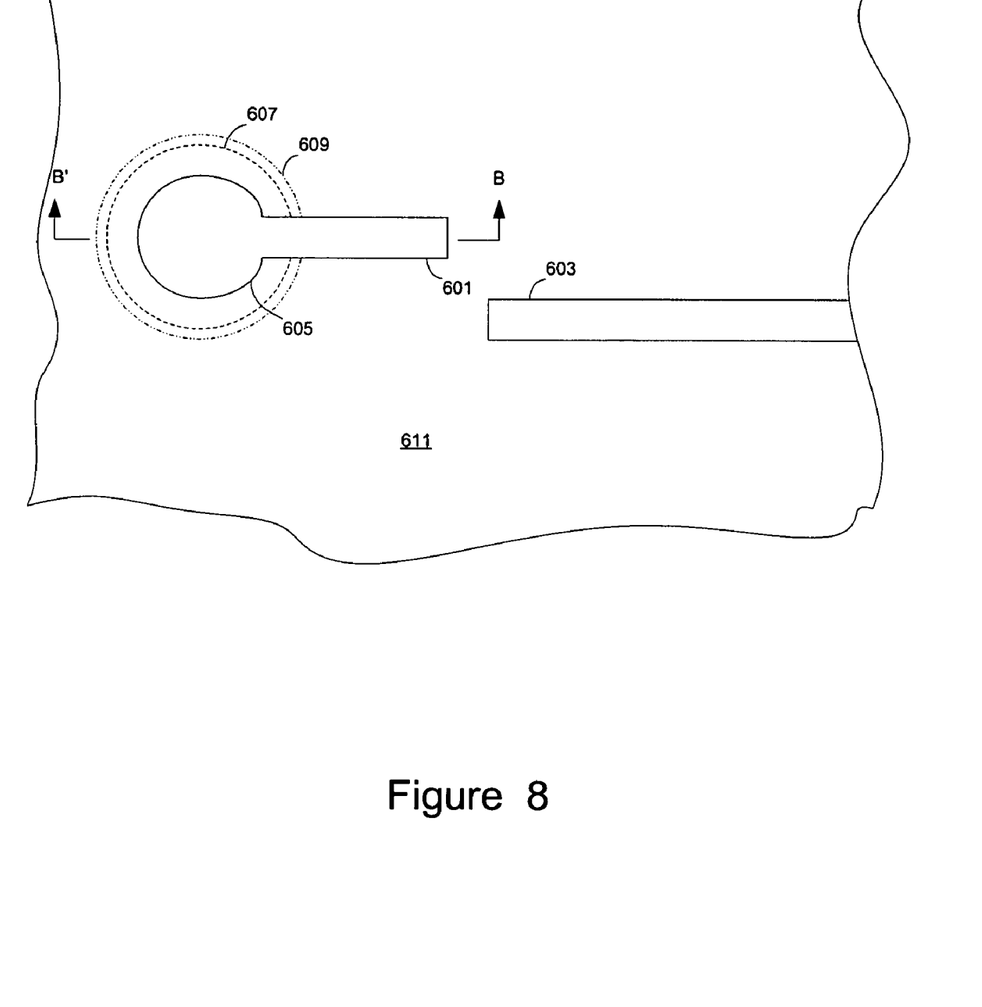
Figure 9:
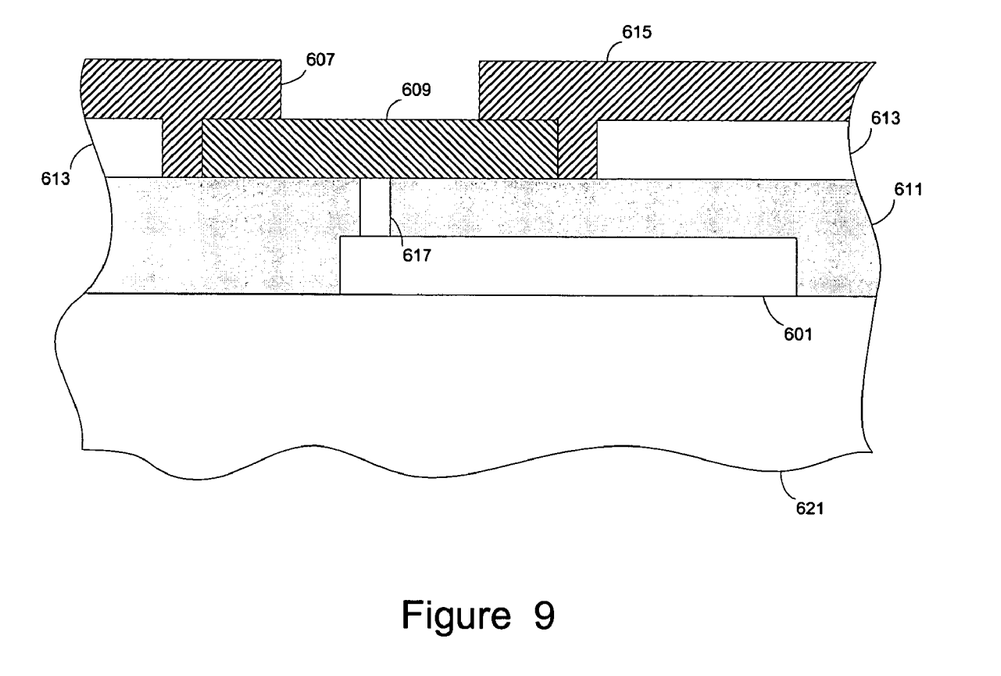

FIG. 9 illustrates a cross section view along line BB' in FIG. 8 for the feature designed to reduce the breakdown voltage of the no-connect pad. In FIG. 9, the no-connect pad (609) and the surrounding metal (613) are formed on the dielectric layer (611) of the substrate (621); and the trace (601) is under the dielectric layer (611). A via (617) connects the trace to the no-connect pad (609). The solder resist layer (615) has an opening (607) to define a land out of the pad (609). Although FIG. 9 illustrates an example where the no-connect pad (609) and the trace (601) leading to the breakdown path are separated by only one dielectric layer (611), the routing from the no-connect pad (609) to the breakdown path can go through a number of dielectric layers and a number of vias and traces.

Figure 10:
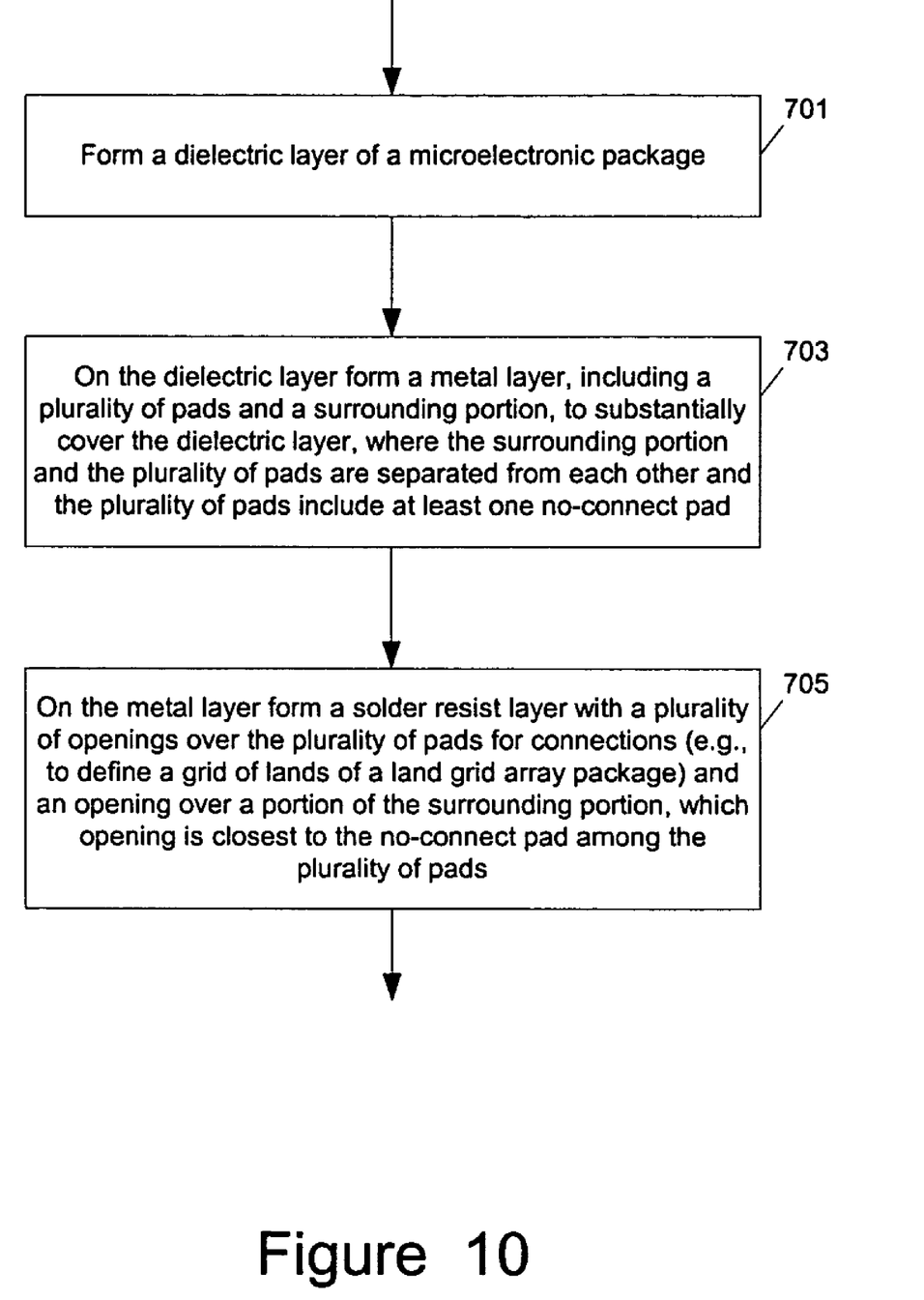
FIG. 10 illustrates a method to make one or more features to control the breakdown voltage for electrostatic discharge according to one embodiment of the present invention.

FIG. 10 illustrates a method to make one or more features to control the breakdown voltage for electrostatic discharge according to one embodiment of the present invention. Operation 701 forms a dielectric layer of a microelectronic package. On the dielectric layer operation 703 forms a metal layer, including a plurality of pads and a surrounding portion, to substantially cover the dielectric layer, where the surrounding portion and the plurality of pads are separated from each other and the plurality of pads include at least one no-connect pad. The metal layer can be formed through etching a blanket metal layer to separate the surrounding portion of the metal layer and the plurality of pads on the dielectric layer, or through an additive or semi-additive metallization process. On the metal layer operation 705 forms a solder resist layer with a plurality of openings over the plurality of pads for connections (e.g., to define a grid of lands of a land grid array package) and an opening over a portion of the surrounding portion, which opening is closest to the no-connect pad among the plurality of pads. For example, the no-connect pad can be formed to have a protruding portion under the solder resist layer, pointing toward the opening over the surrounding portion; the solder resist layer can be formed to have a further opening over the tip portion of the protruding portion of the no-connect pad; and with a separation distance of no more than 80 microns, the openings over a tip portion of the protruding portion of the no-connect pad and the surrounding portion are substantially smaller than the openings over the plurality of pads for connections.

Alternatively, metal traces with sharp corners can be formed in the metal layer, pointing at each other at a minimum separation distance to increase the local electrical field strength between the tips of the metal traces. The metal traces are connected to the surrounding portion and the no-connect pad respectively. Alternatively, the tips of metal traces with a narrow gap can be formed in a different metal layer inside the package with routing to the no-connect pad and surrounding portion (or a selected net) respectively.

Figure 7:
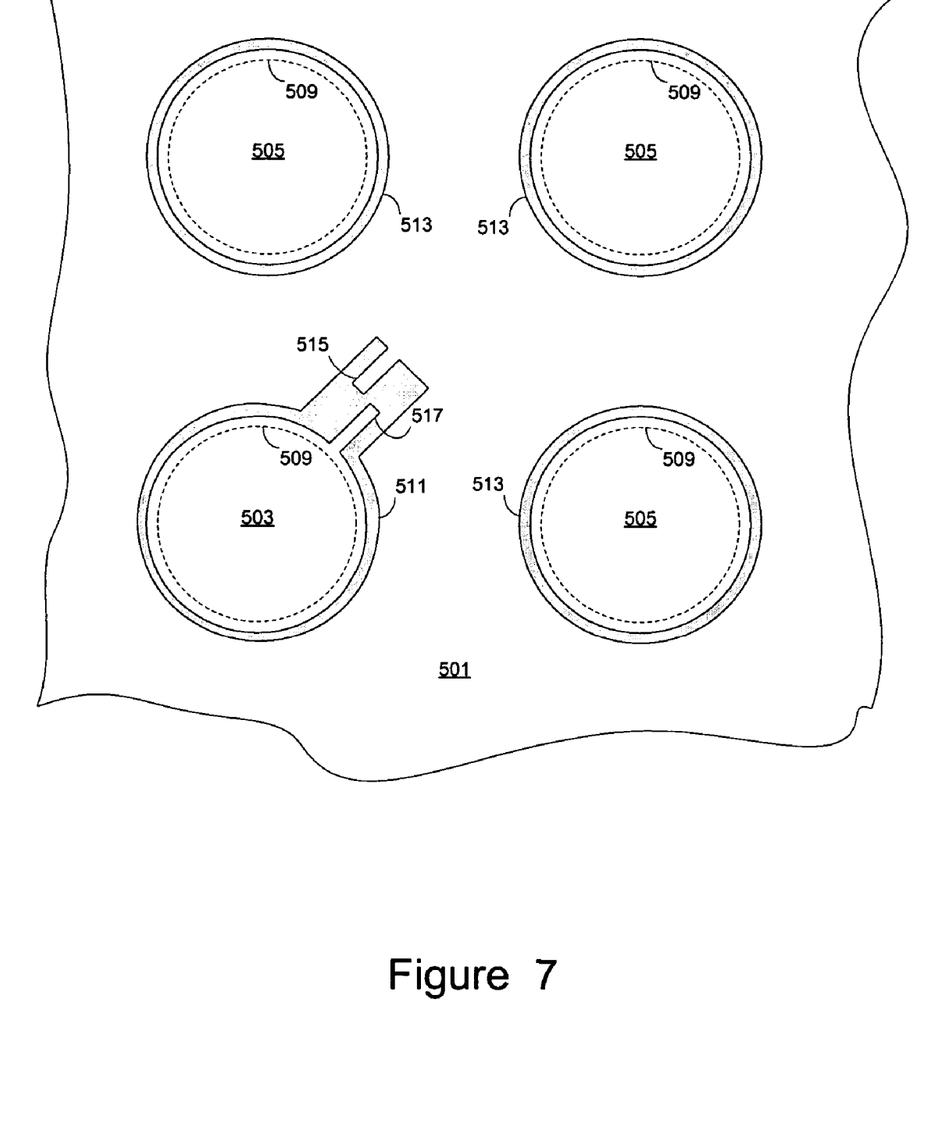

Although the features specifically designed to reduce breakdown voltage on the metal surrounding the no-connect pad are illustrated in a land grid array package, similar features can also be used with other package techniques. As the microprocessor technology demands smaller pitch layout rules, no-connect pins of a pin grid array package may also suffer uncontrolled ESD breakdown problems. Closely positioned solder resist openings as illustrated in FIGS. 2 and 6, or buried traces with corners pointing at each other at a minimum separation distance as illustrated in FIGS. 7 and 8, can also be used with a pin grid array package (or a ball grid array package or column grid array package). Further, different types of features can be used on the same package.

In the foregoing specification, specific exemplary embodiments have been described. It will be evident that various modifications may be made thereto without departing from the broader spirit and scope of the disclosure. The specification and drawings are, accordingly, to be regarded in an illustrative sense rather than a restrictive sense.

What is claimed is:

1. A microelectronic packaging structure, comprising:
   a dielectric layer;
   a plurality of terminals formed on the dielectric layer, the plurality of terminals including a first terminal and second terminals;
   a conductive portion coupled with the dielectric layer and arranged with respect to the first terminal to have an electrostatic discharge (ESD) breakdown path between the conductive portion and the first terminal when sufficient charges accumulate in the first terminal, a length of the breakdown path smaller than a distance between the first terminal and an closest adjacent terminal of the first terminal;
   a solder resist layer formed over the plurality of terminals, the solder resist layer having a first openings to expose the plurality of terminals for connection, the solder resist layer having a second opening to expose the conductive portion, the breakdown path to go through the second opening; and
   wherein the solder resist layer further has a third opening to expose a further portion of the first terminal, the breakdown path to go through both the second and third openings.

2. The structure of claim 1, wherein the first terminal is a no-connect terminal.

3. The structure of claim 1, wherein an electrostatic discharge breakdown along the breakdown path does not damage the structure.

4. The structure of claim 3, wherein a breakdown voltage along the breakdown path is less than 400 volts.

5. The structure of claim 3, wherein the length of the breakdown path is shorter than 140 microns.

6. The structure of claim 3, wherein the breakdown path is through air surrounding the first terminal and the conductive portion.

7. The structure of claim 1, wherein the first openings define lands of a land grid array package.

8. The structure of claim 7, wherein an average spacing between lands of the land grid array package is less than 400 microns.

9. The structure of claim 1, wherein the length of the breakdown path is shorter than 80 microns.

10. The structure of claim 1, wherein each of the second and third openings is substantially smaller than each of the first openings.

11. The structure of claim 1, wherein the first terminal has a non-round shape when projected perpendicular onto the dielectric layer.

12. The structure of claim 11, wherein the first terminal has a protruding portion formed on, and parallel to, the dielectric layer, the third opening to expose a portion of the protruding portion of the first terminal.

13. The structure of claim 12, wherein the protruding portion is arranged to point toward the second opening.

14. The structure of claim 1, further comprising:
   a first conductive trace electrically coupled to the first terminal, the conductive portion comprising a second conductive trace, the breakdown path being between the first and second conductive traces.

15. The structure of claim 14, wherein the first and second traces have corners arranged to point at each other.

16. The structure of claim 15, wherein the breakdown path is through a portion of a dielectric material of the structure.

17. The structure of claim 1, wherein the first terminal has a first protruding portion, the conductive portion having a second protruding portion, the first and second protruding portions arranged to point to each other.

18. The structure of claim 17, wherein the first and second protruding portions have corners arranged to point at each other under a solder resist layer; and the breakdown path is through a portion of a dielectric material of the structure.

19. A microelectronic package, comprising:
   a dielectric layer;
   a plurality of pads formed on the dielectric layer, the plurality of pads comprising at least one no-connect pad;
   a conductive portion formed on the dielectric layer, the conductive portion and the plurality of pads separated from each other on the dielectric layer;
   a solder resist layer formed on the plurality of pads and the conductive portion, the solder resist layer having a plurality of first openings to expose the plurality of pads for connection, the solder resist layer having a second opening to expose a portion of the conductive portion, the second opening arranged to have an electrostatic discharge breakdown path between the conductive portion and the no-connect pad through air, a length of the breakdown path smaller than a distance between the no-connect pad and a closest adjacent pad of the no-connect pad; and
   wherein the no-connect pad has a protruding portion oriented toward the second opening, the solder resist layer having a third opening to expose a portion of the protruding portion, the breakdown path to go through air surrounding the second and third openings.

20. The package of claim 19, wherein a breakdown voltage along the breakdown path is less than 200 volts.

21. The package of claim 19, wherein the plurality of pads comprises a grid array; and the protruding portion is oriented in an angle with respect to the grid array.

22. A microelectronic assembly, comprising:
an integrated circuit chip;
a circuit board; and
an interconnect structure disposed between the integrated circuit chip and the circuit board, the interconnect structure comprising:
a dielectric layer;
a metal layer formed on the dielectric layer, the metal layer comprising a surrounding portion and a plurality of pads, the surrounding portion and the plurality of pads separated from each other, the plurality of pads comprising at least one no-connect pad, at least a portion of the plurality of pads configured to electrically connect the integrated circuit chip and the circuit board;
a solder resist layer on the plurality of pads, the solder resist layer having a plurality of first openings in a grid array to expose the plurality of pads for connections to the circuit board, the solder resist layer having a second opening to expose a portion of the surrounding portion, a distance between the second opening and an opening in the solder resist layer to expose the no-connect pad being smaller than any two openings in the solder resist layer to expose the no-connect pad and a different one of the plurality of pads; and
wherein the no-connect pad has a protruding portion under the solder resist layer, the protruding portion arranged to point toward the second opening, the solder resist layer having a third opening to expose a tip portion of the protruding portion, a distance between the second and third openings being no more than 70 microns.

23. The assembly of claim 22, wherein an average spacing between the plurality of pads is less than 500 microns and larger than the distance between the second and third openings, each of the second and third opening being smaller than each of the first openings.

24. A method, comprising:
forming a metal layer to substantially cover a dielectric layer, the metal layer comprising a plurality of pads and a surrounding portion, the surrounding portion and the plurality of pads being separated from each other, the plurality of pads comprising at least one no-connect pad; and
forming a solder resist layer on the metal layer, the solder resist layer having a plurality of first openings over the plurality of pads, the solder resist layer having a second opening over a portion of the surrounding portion, among the plurality of pads the second opening being closest to the no-connect pad;
wherein the forming of the metal layer comprises:
etching the metal layer to separate the surrounding portion of the metal layer and the plurality of pads on the dielectric layer; and
wherein the no-connect pad has a protruding portion under the solder resist layer pointing toward the second opening, the solder resist layer having a third opening over a tip portion of the protruding portion, the second and third openings being substantially smaller than the first openings, a distance between the second and third openings being no more than 80 microns.

* * * * *